United States Patent

Haehnle et al.

[11] Patent Number: 5,474,876
[45] Date of Patent: Dec. 12, 1995

[54] RADIATION-CROSSLINKABLE MIXTURES CONTAINING CARBOXYL-CONTAINING POLYMERIC PRECURSORS

[75] Inventors: Hans-Joachim Haehnle, Ludwigshafen; Manfred Schwarz, Hamburg-Schenfeld; Rainer Blum, Ludwigshafen, all of Germany

[73] Assignee: BASF Lacke + Farben AG, Muenster, Germany

[21] Appl. No.: 318,190

[22] Filed: Oct. 5, 1994

Related U.S. Application Data

[63] Continuation of Ser. No. 67,808, May 27, 1993, abandoned.

[30] Foreign Application Priority Data

May 29, 1992 [DE] Germany .................. 42 17 688.3

[51] Int. Cl.⁶ .................. G03C 1/725; G03F 7/025; C08F 2/46; C08J 3/28
[52] U.S. Cl. .................. 430/283; 430/281; 430/286; 430/287; 430/906; 430/914; 430/921; 430/922; 522/15; 522/17; 522/25; 522/31; 522/34; 522/904
[58] Field of Search .................. 430/281, 283, 430/286, 287, 906, 914, 920, 921, 922; 522/15, 17, 25, 31, 34, 904

[56] References Cited

U.S. PATENT DOCUMENTS

| | | |
|---|---|---|
| 3,953,877 | 4/1976 | Sigusch et al. . |
| 3,957,512 | 5/1976 | Kleeberg et al. . |
| 4,040,831 | 8/1977 | Rubner et al. . |
| 4,045,223 | 8/1977 | Rubner et al. . |
| 4,058,400 | 11/1977 | Crivello ............... 96/86 |
| 4,058,401 | 11/1977 | Crivello ............... 96/115 R |
| 4,088,489 | 5/1978 | Rubner et al. . |
| 4,212,398 | 7/1980 | Rubner et al. . |
| 4,243,743 | 1/1981 | Hiramoto et al. . |
| 4,287,294 | 9/1981 | Rubner et al. ............. 430/306 |
| 4,299,938 | 11/1981 | Green et al. ............. 526/192 |
| 4,385,165 | 5/1983 | Ahne et al. . |
| 4,551,522 | 11/1985 | Fryd et al. ............. 528/351 |
| 4,558,117 | 12/1985 | Nakano et al. ............. 528/184 |
| 4,598,038 | 7/1986 | Ahne . |
| 4,608,333 | 8/1986 | Ohbayashi et al. ............. 430/281 |
| 4,610,947 | 9/1986 | Ahne et al. . |
| 4,654,415 | 3/1987 | Ahne et al. . |
| 4,656,244 | 4/1987 | Ahne . |
| 4,801,681 | 1/1989 | Ahne . |
| 5,093,223 | 3/1992 | Iwasawa et al. ............. 430/904 X |
| 5,101,053 | 3/1992 | Boettcher ............. 556/64 |

FOREIGN PATENT DOCUMENTS

430221 6/1991 European Pat. Off. .

*Primary Examiner*—Marion E. McCamish
*Assistant Examiner*—Bernard Codd
*Attorney, Agent, or Firm*—Keil & Weinkauf

[57] ABSTRACT

A radiation-crosslinkable mixture which contains a carboxyl-containing precursor of a heterocyclic polymer, a copolymerizable ethylenically unsaturated ternary sulfonium salt, a photoinitiator and a polar aprotic organic solvent.

6 Claims, No Drawings

RADIATION-CROSSLINKABLE MIXTURES CONTAINING CARBOXYL-CONTAINING POLYMERIC PRECURSORS

This application is a continuation of application Ser. No. 08/067,808, filed on May 27, 1993, now abandoned.

BACKGROUND OF THE INVENTION

1. Field of the Invention

The present invention relates to radiation-crosslinkable mixtures which contain soluble polymeric precursors of heterocyclic polymers stable at high temperatures, copolymerizable ethylenically unsaturated compounds, photoinitiators, solvents and, if required, further assistants and additives, and their use for the production of relief structures which are stable at high temperatures, heterocyclic polymers stable at high temperatures being in particular polyimides, polyisoindoloquinazolinediones and polyaroylenebenzimidazoles whose precursors still carry free carboxyl groups.

2. Description of Prior Art

It is known that relief structures which are stable at high temperatures can be produced, in particular for the production of electronic circuits, by first applying soluble, radiation-sensitive, preferably UV-sensitive precursors A from solution onto a substrate and drying them under mild conditions, then forming a crosslinked intermediate B under a mask using radiation of a suitable wavelength then washing out the unradiated, i.e. unexposed, parts, which still contain the precursor A, with suitable solvent mixtures and then converting the resulting relief structures into the final functional structure of stage C with the use of high temperatures (heating step).

For the production of such relief structures which are used, for example, as interlayer dielectrics or as passivation layers for microchips, the abovementioned heterocyclic or aromatic/heterocyclic polymers are preferably used as substances of functional stage C, owing to the high thermal and mechanical loads during the preparation.

The soluble precursors A for such polymers C are generally compounds having a polyamide parent structure, i.e. those in which another group, as a rule a carboxyl or ester group, is ortho or peri to the amido group and undergoes a condensation reaction with the amido group during the conversion in stage C with the use of elevated temperatures.

A method for rendering polymeric, polyamide parent structures of stage A radiation-crosslinkable is the introduction of unsaturated side groups, as illustrated for a polyamidoester:

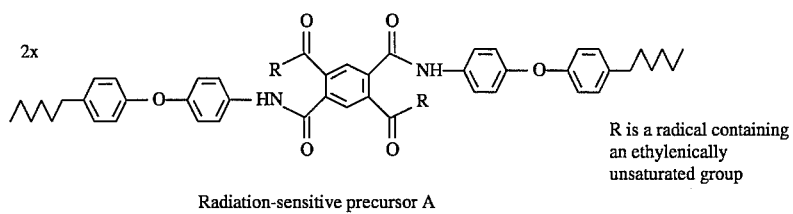

Radiation-sensitive precursor A

R is a radical containing an ethylenically unsaturated group

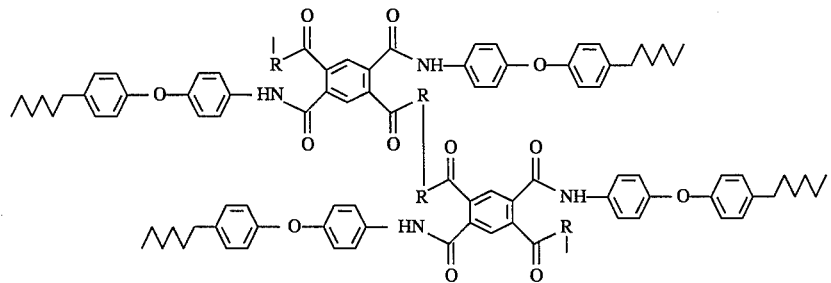

Radiation-crosslinked intermediate B

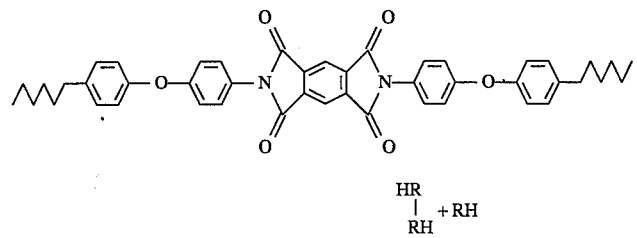

$$\begin{array}{c} HR \\ | \\ RH \end{array} + RH$$

-continued

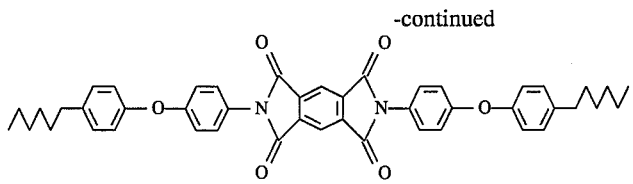

Final functional structure C

The introduction of unsaturated groups into polymeric precursors A is described in, for example, DE-A-2 473 397, DE-A-2 437 348, DE-A-2 437 413,DE-A-2 437 369, DE-A-2 919 840, DE-A-2 919 841, DE-A-2 933 826 and DE-A-2 308 830.

In general, the following three methods are used for synthesizing photosensitive precursors A according to the prior art:

a) The introduction of photosensitive groups, as a rule ethylenically unsaturated groups, into the monomer building blocks and subsequent synthesis of the higher molecular weight precursors.

A typical example of this method is described in DE-A-2 437 397, i.e. the addition reaction of allyl alcohol with pyromellitic anhydride, the reaction of the resulting half-ester with thionyl chloride to give the acyl chloride and conversion of the latter into the polymers by reaction with aromatic diamines.

Further prior art publications which describe synthesis routes starting from unsaturated monomer building blocks are, for example, DE-A-2 437 369, DE-A-2 437 413, DE-A-2 919 840, DE-A-2 919 841, DE-A-3 411 660, DE-A-3 411 697, DE-A-3 411 706, DE-A-3 411 714, U.S. Pat. No. 4,551,522 and U.S. Pat. No. 4,558,117.

b) Another method for introducing photosensitive unsaturated groups comprises first synthesizing polymeric or oligomeric products without photosensitive groups and then introducing photosensitive groups into these products.

A typical example of this method is described in, for example, DE-A-2 933 826. Here, pyromellitic anhydride and diaminodiphenyl oxide in dimethylacetamide as a solvent are subjected to an addition reaction to give a polyamide which contains carboxyl groups. Double bonds are then introduced into these carboxyl groups by means of glycidyl methacrylate, resulting in the precursors A which are crosslinkable in the presence of photoinitiators under UV light.

The principal disadvantages of the prior art method a) are the expensive reaction sequence and the difficulties in synthesizing the polymeric precursors A, which arise from the unsaturated nature of the starting materials and the end products.

It is also difficult subsequently to introduce double bonds into polymeric products by method b). Here, for example, only relatively low temperatures may be used, resulting in long reaction times and poor conversions. Furthermore, polymerization inhibitors must nevertheless be added in some cases during the preparation and subsequently removed in expensive purification steps in order to achieve high photosensitivity during use.

Furthermore, a number of the abovementioned patents therefore relate not to the principle but to optimization of the methods for the preparation of the polymeric, photosensitive precursors. Nevertheless, their preparation remains critical.

c) In order to avoid these problems, other patents propose likewise first synthesizing non-photosensitive polyamic acids as in method b) and subsequently rendering them photosensitive in a very mild manner by simply adding unsaturated amines which form salts with polyamic acids (cf. for example DE-A-2 914 619). The main problems in this method are the poor solubility of the polymer salts and their high viscosity, so that only solutions having low solids contents can be prepared. Finally, the precursors prepared according to c) have, at room temperature, a shelf life which is insufficient for processing.

A further fundamental problem relates to the heating step of the precursors A prepared according to a) or b). Since the unsaturated groups are covalently bonded to the precursors of the heterocyclic polymers, high temperatures must be used for relatively long times in order to achieve quantitative cyclization. During this procedure, not only do the relief structures produced become black but the desired mechanical properties, such as flexural strength and buckling resistance, are not achieved. As a result of the trend in microelectronics toward increasingly large and increasingly highly integrated chips, it is precisely these properties which are becoming more and more important for ensuring the desired reliability of the components produced and for minimizing the defect rate in production.

SUMMARY OF THE INVENTION

It is an object of the present invention to provide photoresists based on soluble precursors or, for example, polyamides, polyisoindoloquinazolinedione, polyaroylenebenzimidazole or other polyheterocycles, which avoid the abovementioned disadvantages, i.e. can be reproduced simply and reproducibly and give relief structures having the desired flexural strength and buckling resistance.

Surprisingly, we have found that this object is very advantageously achieved by the novel mixtures.

DESCRIPTION OF THE PREFERRED EMBODIMENT

The present invention relates to radiation-crosslinkable mixtures which consist essentially of (I) at least one carboxyl-containing polymeric precursor of heterocyclic polymers stable at high temperatures, which precursor is soluble in polar organic solvents, (II) at least one copolymerizable ethylenically unsaturated ternary sulfonium salt, (III) at least one photoinitiator or photoinitiator system and (IV) at least one polar aprotic organic solvent.

Preferred components (I) are polyamic acids of the general structure

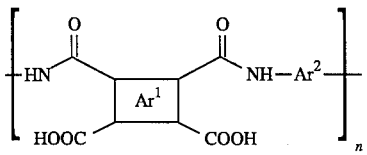

where the carboxyl groups are bonded to $Ar^1$ so that they are ortho or peri to the amido groups, $Ar^1$ is a substituted or unsubstituted tetravalent aromatic, araliphatic, alicyclic, aliphatic or heterocyclic radical and $Ar^2$ is a substituted or unsubstituted divalent, aromatic, araliphatic, alicyclic, aliphatic or heterocyclic radical. The polyamic acid may be a random copolymer or a block copolymer, and at least 2 different groups $Ar^1$ and/or $Ar^2$ may be present in the polyamic acid.

Preferred components (II) are reaction products of thiodiglycol with glycidyl (meth)acrylate and an organic mono-, di- or polycarboxylic acid.

In further preferred embodiments of the novel mixtures, a ternary sulfonium salt which contains at least one ethylenically unsaturated group both in the cation and in the anion is used as component (II), and the ethylenically unsaturated groups contained in component (II) are acrylate or methacrylate groups.

Preferred components (III) are azides.

The novel mixtures may additionally contain reactive diluents, i.e. ethylenically unsaturated copolymerizable organic compounds which differ from component (II) and, if required, further assistants or additives, such as leveling agents, sensitizers and/or adhesion promoters.

The present invention furthermore relates to a process for the production of relief structures which are stable at high temperatures, by imagewise exposure of layers of radiation-sensitive mixtures applied to a substrate and removal of the unexposed parts of these layers, wherein the layers of radiation-sensitive mixtures consist of novel mixtures.

Regarding the components of the novel mixtures and regarding the novel process for the production of relief structures which are stable at high temperatures, the following may be stated specifically.

The novel mixture contains, as component (I), carboxyl-containing polymeric precursors of heterocyclic polymers stable at high temperatures, which precursors are soluble in polar aprotic organic solvents.

Precursors of such polyheterocycles are generally obtained by reacting aromatic, heterocyclic or cycloaliphatic dianhydrides of the general formula $O(CO)_2R(CO)_2O$ with unsubstituted or substituted polyamines.

Examples of suitable dianhydrides, without restriction to these, are the dianhydrides of pyromellitic acid or of benzene-1,2,3,4-tetracarboxylic acid, dianhydrides of 4,4-esterification, 4,4-etherification and 4,4-amidation dimers of trimellitic acid, dianhydrides of
3,3',4,4'-biphenyltetracarboxylic acid,
2,2',4,4'-biphenyltetracarboxylic acid,
2,3,3',4'-biphenyltetracarboxylic acid,
3,3',4,4'-benzophenonetetracarboxylic acid,
2,2',3,3'-benzophenonetetracarboxylic acid,
2,3,3',4'-benzophenonetetracarboxylic acid,
2,3,6,7-naphthalenetetracarboxylic acid,
1,2,5,6-naphthalenetetracarboxylic acid,
1,2,4,5-naphthalenetetracarboxylic acid,
1,4,5,8-naphthalenetetracarboxylic acid,
1,2,6,7-naphthalenetetracarboxylic acid,
2,6-dichloronaphthalene-1,4,5,8-tetracarboxylic acid,
2,7-dichloronaphthalene-1,4,5,8-tetracarboxylic acid,
2,3,6,7-tetrachloronaphthalene-1,4,5,8-tetracarboxylic acid,
1,4,5,8-tetrachloronaphthalene-2,3,6,7-tetracarboxylic acid,
4,8-dimethyl-1,2,3,5,6,7-hexahydronaphthalene-1,2,5,6-tetracarboxylic acid,
4,8-dimethyl-1,2,3,5,6,7-hexahydronaphthalene-2,3,6,7-tetracarboxylic acid,
4,4'-oxydiphthalic acid,
3,3'-oxydiphthalic acid,
4,4'-sulfonyldiphthalic acid,
4,4'-sulfonyldiphthalic acid,
4,4'-thiodiphthalic acid,
3,3'-thiodiphthalic acid,
4,4'-acetylidenediphthalic acid,
bis(2,3-dicarboxyphenyl)methane,
bis(3,4-dicarboxyphenyl)methane,
1,1-bis(2,3-dicarboxyphenyl)ethane,
1,1-bis(3,4-dicarboxyphenyl)ethane,
2,2-bis(2,3-dicarboxyphenyl)propane,
2,2-bis(3,4-dicarboxyphenyl)propane,
phenanthrene-1,2,7,9-tetracarboxylic acid,
phenanthrene-1,2,6,7-tetracarboxylic acid,
phenanthrene-3,4,5,6-tetracarboxylic acid,
phenanthrene-1,2,9,10-tetracarboxylic acid,
2,3,9,10-perylenetetracarboxylic acid,
3,4,9,10-perylenetetracarboxylic acid,
2,3,8,9-perylenetetracarboxylic acid,
4,5,10,11-perylenetetracarboxylic acid,
4,5,11,12-perylenetetracarboxylic acid,
3,3'',4,4''-terphenyltetracarboxylic acid,
2,2'',3,3''-p-terphenyltetracarboxylic acid,
2,3,3'',4''-p-terphenyltetracarboxylic acid,
butane-1,2,3,4-tetracarboxylic acid,
cyclopentane-1,2,3,4-tetracarboxylic acid,
pyrrolidine-2,3,4,5-tetracarboxylic acid,
thiophene-2,3,4,5-tetracarboxylic acid,
pyrazine-2,3,5,6-tetracarboxylic acid,
tetrahydrofurantetracarboxylic acid,
9-bromo-10-mercaptoanthracenetetracarboxylic acid,
9,10-dimercaptoanthracenedicarboxylic acid and
2,6-endovinylenecyclohexane-1,2,4,5-tetracarboxylic acid,
which may be used individually or as a mixture for the synthesis of the precursor of the polyheterocycles.

Polyamines are understood as being aromatic, araliphatic, heterocyclic, cycloaliphatic or aliphatic compounds of the following type:

$$S_nR\ (NH_2)_m$$

where $0 \leq n \leq m$ $1 < m$, n and m are each integers, R is an aromatic, araliphatic, heterocyclic, cycloaliphatic or aliphatic radical and S=OH, COOH, $NH_2$, $CONH_2$ or $CSNH_2$.

Examples of suitable polyamines, without restriction to these, are:
p-phenylenediamine,
m-phenylenediamine,
4,4'-diaminodiphenyl oxide,
3,3'-diaminodiphenyl oxide,
3,4'-diaminodiphenyl oxide,
4,4'-diaminodiphenyl sulfide,
3,3'-diaminodiphenyl sulfide,
3,4'-diaminodiphenyl sulfide,
4,4'-diaminodiphenyl sulfone,
3,3'-diaminodiphenyl sulfone,
3,4'-diaminodiphenyl sulfone, 4,4'-diaminodiphenyl methane,
3,3'-diaminodiphenyl methane,
3,4'-diaminodiphenyl methane,
(4,4'-diaminodiphneyl)-propane,
(3,3'-diaminodiphenyl)-propane,
(4,4'-diaminodiphenyl)-ethane,
(3,3'-diaminodiphenyl)-ethane,
4,4'-bis(4,4'-aminophenoxy)-biphenyl,
4,4'-bis(4,3'-aminophenoxy)-biphenyl,
2,2-bis[4-(4,4-aminophenoxy)phenyl]-propane,
2,2-bis[4-(4,4-aminophenoxy)phenyl]-perfluoropropane,
2,2-bis[4-(3,4-aminophenoxy)phenyl]-propane,
2,2-bis[4-(3,3'-aminophenoxy)phenyl]-propane,
2,2-bis[4-(4,4'-aminophenoxy)phenyl]sulfone,
2,2-bis[4-(3,4-aminophenoxy)phenyl]sulfone,
2,2-bis[4-(3,3'-aminophenoxy)phenyl]sulfone,
4,4'-dimethyl -3,3'-diaminodiphenyl sulfone,
2,2-bis[4-(4,4'-aminophenoxy)phenyl]sulfide,
2,2-bis[4-(3,4-aminophenoxy)phenyl]sulfide,
2,2-bis[4-(3,3'-aminophenoxy)phenyl]-sulfide,
2,2-bis[4-(4,4'-aminophenoxy)phenyl]-methane,
2,2-bis[4-(3,4-aminophenoxy)phenyl]-methane,
2,2-bis[4-(3,3'-aminophenoxy)phenyl]-methane,
1,4-bis-(4,4'-aminophenoxy)-phenylene,
1,4-bis-(3,4'-aminophenoxy)-phenylene,
1,4-bis-(3,3'-aminophenoxy)-phenylene,
4,4'-diaminobenzanilide,
3,4'-diaminobenzanilide,
3,3'-diaminobenzanilide,
4,4'-diaminobiphenyl(benzidine),
3,4'-diaminobiphenyl,
3,3'-diaminobiphenyl,
3,3'-dimethoxy-4,4'-diaminobiphenyl,
3,3'-dimethoxy-3,4'-diaminobiphenyl,
3,3'-dimethyl-4,4'-diaminobiphenyl,
3,3'-dimethyl-3,4'-diaminobiphenyl,
1,8-diaminonaphthalene,
1,5-diaminonaphthalene,
p-terphenyl-4,4''-diamine,
p-terphenyl-3,3''-diamine,
5-tert-butyl-2,4-toluylenediamine,
3-tert-butyl-2,6-toluylenediamine,
3,5-diethyl-2,4-toluylenediamine,
3,5-diethyl-2,6-toluylenediamine,
α,ω-diamino-(polyphenylene sulfides),
m-xylylenediamine,
p-xylylenediamine,
bis-4,4'-[(2,6-diisopropyl)aminophenyl]methane,
bis-4,4'-[(2-methyl-6-isopropyl)aminophenyl]methane,
bis-4,4'-[(2,6-dimethyl)aminophenyl]methane,
bis-4,4'-[(2,6-diisopropyl)aminophenyl]ether,
bis-4,4'-[(2-methyl-6-isopropyl)aminophenyl]ether,
bis-4,4'-[(2,6-dimethyl)aminophenyl]ether,
diamino-(dimethyl)-dicyclohexylmethane,
diamino-(dimethyldiisopropyl)-dicyclohexylmethane,
diamino-(tetraisopropyl)-dicyclohexylmethane,
diamino-(diisopropyl)-dicyclohexylmethane,
diisopropyltoluylenediamine,
alkylisopropyltoluylenediamine,
3,3',4,4'-tetraaminobiphenyl,
3,3',4,4'-tetraaminodiphenylmethane,
3,3',4,4'-tetraaminodiphenyl ether,
3,3',4,4'-tetraaminodiphenyl sulfone,
3,3',4,4'-tetraaminodiphenyl sulfide,
3,3'-dihydroxybenzidine,
hexafluoro-2,2-bis-(4-hydroxy-3-aminophenyl)-propane,
methylenebisanthranilic acid,
2,4-diaminobenzoic acid,
methylenebisanthranilamide and
2,4-diaminobenzamide.

For the purposes of the present invention, polyamines are also to be understood as meaning compounds which contain the structural element N—N, i.e. derivatives of hydrazine.

In the preparation of the precursors of the polyheterocycles, regulators may advantageously be added. This makes it possible to control the solids content and the viscosity of the precursors, the reproducibility being improved at the same time.

In the absence of regulators, high molecular weight and hence viscous solutions which are difficult to process are obtained.

Furthermore, where the regulators are ethylenically unsaturated compounds, the addition of regulators improves the photosensitivity of the resists produced from these precursors, since the regulators are incorporated as terminal groups in the polyheterocyclic precursors. The structural formulae of regulated polyamic acids are shown as an example.

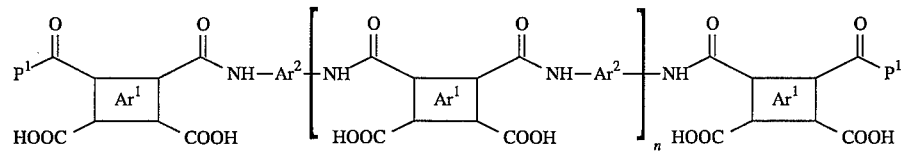

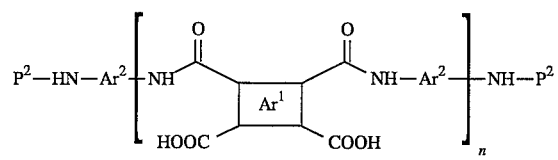

$P^1$=—O—$R^1$ or —NH—$R^1$
$P^2$=—CO—$R^1$, —CO—NH—$R^1$ or —CO—O$R^1$
$R^1$=aliphatic, cycloaliphatic, araliphatic, aromatic or heterocyclic radical which preferably contains a polymerizable multiple bond.

Regulation is effected by reacting some of the dianhydride and/or some of the polyamine with the regulator component before or during the preparation of the polyheterocyclic precursor, so that monofunctional polymer building blocks which act as terminal groups in the polymer chain are obtained for the purposes of the polymer synthesis.

Suitable regulators for the dianhydrides are monohydroxy or monoamino compounds, preferably those which carry unsaturated groups, e.g.
2-hydroxyethyl acrylate,
2-hydroxyethyl methacrylate,
glyceryl diacrylate,
glyceryl dimethacrylate,
3-hydroxypropyl acrylate,
3-hydroxypropyl methacrylate,
2-hydroxypropyl acrylate,
2-hydroxypropyl methacrylate,
4-hydroxybutyl acrylate,
4-hydroxybutyl methacrylate,
polyethylene glycol-modified acrylate,
polypropylene glycol-modified acrylate,
polyethylene glycol-modified methacrylate,
polypropylene glycol-modified methacrylate,
pentaerythrityl triacrylate,
pentaerythrityl trimethacrylate,
dipentaerythrityl pentaacrylate,
dipentaerythrityl pentamethacrylate,
trimethylolpropane diacrylate,
dimethylolpropane dimethacrylate,
cinnamyl alcohol,
allyl alcohol,
pentaerythrityl triallyl ether,
trimethylolpropane diallyl ether,
4-hydroxybutyl allyl ether,
glyceryl diallyl ether,
allylamine,
diallylamine and
4-aminostyrene.

Suitable regulators for the polyamines are monoanhydrides or monoisocyanates, preferably those which carry unsaturated groups, e.g.:
maleic anhydride,
itaconic anhydride,
methacrylic anhydride,
acrylic anhydride,
isocyanatoethyl methacrylate,
1-(1-isocyanato-1-methylethyl)-4-(1-methylethenyl)benzene,
monoadducts of unsaturated alcohols with 2,4-toluylene diisocyanate and
monoadducts of unsaturated alcohols with 2,4'-isocyanatodiphenylmethane.

Regarding the starting components to be reacted with one another and the reaction conditions, it should be stated that the reaction is advantageously carried out at from −10° to +100° C. in highly polar organic solvents.

Component (I) is present in the novel mixture in general in an amount of from 5 to 60, preferably from 20 to 45, % by weight, based on the total mixture.

The novel mixture contains, as component (II), copolymerizable ethylenically unsaturated ternary sulfonium salts.

Ternary sulfonium salts are reaction products of thioethers with epoxides in the presence of an acid, or of thioethers with other alkylating agents, such as alkyl halides, alkyl sulfates, etc. What is decisive is that at least one of the components used contains an unsaturated, polymerizable multiple bond, so that the resulting sulfonium salt contains at least one unsaturated, polymerizable multiple bond, either in the sulfonium moiety or in the counter-ion

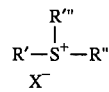

where R', R" and R'" are each an aliphatic, aromatic, araliphatic or cycloaliphatic radical, possibly interrupted by O, N, S, a carbonyl group or an ester or amide bond and unsubstituted or substituted by OH and $X^-$ is an organic or inorganic anion whose nucleophilicity is so low that it does not react with the sulfonium group at room temperature.

Reaction products of saturated or unsaturated thioethers with unsaturated epoxides, e.g. glycidyl methacrylate or glycidyl acrylate, in the presence of an acid, or the reaction products of unsaturated thioethers with saturated epoxides in the presence of an acid, are particularly preferred.

Preferred reactions are those in which the thioethers are hydroxyl-substituted, for example the sulfonium salt of the general formula

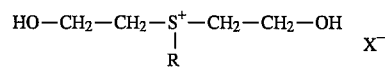

where R contains an ethylenically unsaturated group and $X^-$ is an organic or inorganic anion.

The reactions in which the acid used carries a polymerizable multiple bond in addition to the epoxide or thioether are also preferred, for example crotonic acid, methacrylic acid, acrylic acid, fumaric acid, cinnamic acid, maleic acid, propiolic acid, 2-acrylamidoglycolic acid, 2,2-bis(acrylamido)acetic acid, the adducts generally of unsaturated alcohols or amines (as listed above as regulators) with mono- or polyanhydrides, e.g. 4-(2-methacryloyloxyethyl)-maleic acid, 4-(2-acryloyloxyethyl)-maleic acid, monomethacryloyloxyethyl phthalate, monoacryloyloxyethyl phthatate, di-(2-methacryloyloxyethyl)pyromellitate, N,N-diallylmaleic acid monoamide and N,N-diallylitaconic acid monoamide.

Reaction products of thiodiglycol with unsaturated epoxides and the abovementioned unsaturated acids are very particularly preferred.

Component (II) is present in the novel mixture in an amount of from 1 to 50, preferably from 10 to 35, % by weight, based on the total mixture.

The novel mixture contains, as component (III), a photoinitiator or a photoinitiator system.

Suitable photoinitiators are virtually all known systems, for example H-abstracting systems, α-cleavers and particularly preferably azides. Examples are:
benzophenone,
acetophenone,
benzanthrone,
anthrones,
4,4'-N,N,N',N'-tetramethyldiaminobenzophenone (Michler's ketone),
phenanthrenes,
2-nitrofluorene,
nitroacenaphthene,
benzoquinone,
N-acetyl-p-nitroaniline,
p-nitroaniline,
2-ethylanthraquinone,
2-tert-butylanthraquinone,
N-acetyl-4-nitro-1-naphthylamine,
picramides, 1,2-benzanthraquinone,
3-methyl-1,3-diaza-1,9-benzanthrone,
4,4'-tetraethyldiaminobenzophenone,
2-chloro-4-nitroaniline,
dibenzalacetone,
1,2-naphthoquinone,
2,5-bis-(4'-diethylaminobenzal)-cyclopentane,
2,6-bis-(4'-diethylaminobenzal)-cyclohexanone,
2,6-bis-(4'-diethylaminobenzal)-methylcyclohexanone,
2,6-bis-(4'-dimethylaminobenzal)-methylcyclohexanone,
4,4'-bis-(dimethylamino)-chalcone,
4,4'-bis-(diethylamino)-chalcone,
p-dimethylaminobenzylideneindanone,
1,3-bis-(4'-dimethylaminobenzal)-acetone,
1,3-bis-(4'-diethylaminobenzal)-acetone,
N-phenyldiethanolamine,
N-p-tolyldiethylamine,
styrene derivatives,
cumarin derivatives,
2,2-dimethoxy-2-phenylacetophenone,
1-hydroxycyclohexyl phenyl ketone,
2-methyl-[(4-methylthio)-phenyl]-2-morpholino-1-propane,
3,3',4,4'-tetra-(tert-butylperoxycarbonyl)-benzophenone,
benzoin isopropyl ether,
benzoin isobutyl ether,
4,4'-dimethoxybenzyl,
1,4-dibenzoylbenzene,
4-benzoylbiphenyl,
2-benzoylnaphthalene,
methyl o-benzoylbenzoate,
2,2'-bis-(o-chlorophenyl)-4,4',5,5'-tetraphenyl-1,2-bisimidazole,
10-butyl-2-chloroacridone,
ethyl 4-dimethylaminobenzoate,
dibenzoyl methane,
2,4-diethylthioxanthone,
3,3-dimethyl-4-methoxybenzophenone,
2-hydroxy-2-methyl-1-phenylpropan-1-one,
1-(4-isopropylphenyl)-2-hydroxy-2-methylpropan-1-one,
1-(4-dodecylphenyl)-2-hydroxy-2-methylpropan-1-one,
1-phenyl-1,2-butanedione 2-(o-methoxycarbonyl)-oxime,
1-phenylpropanedione 2-benzoyloxime,
1,2-diphenylethanedione 1-(o-benzoyl)-oxime,
1-phenyl-3-ethoxypropanetrione 2-(o-benzoyl)-oxime,
glycerol derivatives,
oxazolone derivatives,
substituted hexaarylbisimidazoles,
2-(4-methoxyphenyl)-4,6-di-(trichloromethyl)-1,3,5-triazine,
2-piperonyl-4,6-di-(trichloromethyl)-1,3,5-triazine,
2-(4-methoxynaphthyl)-4,6-di-(trichloromethyl)-1,3,5-triazine and preferably
azides whose $N_3$ group is bonded to an aromatic ring directly or via an $SO_2$ or CO group, e.g.
2-(N,N-dimethylamino)-ethyl 4-azidocinnamate,
2-(N,N-dimethylamino)-ethyl 4-azidonaphthyl ketone,
2-(N,N-dimethylamino)-ethyl 4-azidobenzoate,
5-azido-naphthyl-2'-(N,N-dimethylamino)-ethyl sulfone,
N-(4-sulfonylazidophenyl)-maleimide,
N-acetyl-4-sulfonylazidoaniline,
4-sulfonylazidoaniline,
4-azidoaniline,
4-azidophenacyl bromide,
p-azidobenzoic acid,
2,6-bis(p-azidobenzylidene)cyclohexanone and
2,6-bis(p-azidobenzylidene)-4-methylcyclohexanone.

Mixtures of azides with photoinitiators which do not contain azido groups are also suitable here.

Component (III) is present in the novel mixture in amounts of from 0.01 to 10, preferably from 0.5 to 5, % by weight.

According to the invention, polar aprotic organic solvents are used as component (IV).

For the preparation of the abovementioned precursors of polyheterocycles (I) is also carried out, as a rule, in highly polar, preferably aprotic, solvents. Examples of such solvents are: formamide, acetamide, N-methylformamide, N,N-dimethylformamide, N,N-diethylformamide, N-methylpyrrolidone, N,N-dimethylacetamide, N,N-diethylacetamide, γ-butyrolactone, caprolactam, pyrrolidone, dimethyl sulfoxide, sulfolane, dimethyl sulfone, hexamethylenephosphorotriamide, dimethylpropyleneurea, dimethylethyleneurea, etc., N-methylpyrrolidone, dimethylacetamide, γ-butyrolactone and dimethyl sulfoxide being preferred.

Some of these polar substances can be replaced with further solvents, such as alcohols, esters, ketones, ethers and hydrocarbons.

Component (IV) may be present in the novel mixture in general in amounts of from 10 to 80, preferably from 40 to 60, % by weight.

The novel mixture may additionally contain ethylenically unsaturated copolymerizable organic compounds which differ from component (II), i.e. reactive diluents.

Reactive diluents are, as a rule, low-viscosity, mono- or polyethylenically unsaturated compounds which are added for increasing the photosensitivity and improving processibility. Compounds from the class consisting of the acrylates and methacrylates and polyfunctional members thereof are preferred for this purpose.

The following are particularly suitable: hydroxyalkyl (meth)acrylate, such as hydroxyethyl acrylate, hydroxyethyl methacrylate, hydroxypropyl acrylate and hydroxypropyl methacrylate, butanediol monoacrylate, butanediol monomethacrylate, N-hydroxymethylacrylamide, N-hydroxymethylmethacrylamide, diethylene glycol monoacrylate, diethylene glycol monomethacrylate, glyceryl dimethacrylate, glyceryl diacrylate, glyceryl trimethacrylate, glyceryl triacrylate, trimethylolpropane dimethacrylate, trimethylolpropane diacrylate, trimethylolpropane trimethacrylate, trimethylolpropane triacrylate, pentaerythrityl trimethacrylate, pentaerythrityl triacrylate, diacetone (meth)acrylamide, cinnamyl alcohol, hydroxyalkylcinnamates and hydroxycinnamyl alcohol or mixtures of the stated compounds.

Furthermore, amide compounds having carbon-carbon double bonds, such as N-acryloylpiperidine, N-acryloylmorpholine, acrylamide, methacrylamide, N-methylacrylamide, N-methylmethacrylamide, N-ethylacrylamide, N-ethylmethacrylamide, acrylamidoglycol acid and further N-alkylacrylamides, N,N-dimethylacrylamide, N,N-dimethylmethacrylamide, N,N-diethylacrylamide, N,N-diethylmethacrylamide, further N,N-dialkyl (meth)acrylamides, N,N-dimethylaminoethyl (meth)acrylamide, N,N-dimethylaminopropyl (meth)acrylamide and further N-aminoalkyl (meth)acrylamides and N,N-diaminoalkyl (meth)acrylamides, N-aminoalkoxyalkyl (meth)acrylamide and N,N-diaminoalkoxyalkyl(meth)acrylamides and N-vinylpyrrolidone, are very particularly suitable.

The methylolation products of acrylamide and methacrylamide and ether-like condensates thereof with mono- or polyfunctional alcohols are also particularly suitable.

These reactive diluents may be added to the novel mixture in amounts of up to 25% by weight, based on the total amount.

Further assistants or additives in small amounts of up to 10% by weight may be added to the novel mixtures in order to achieve certain desired effects.

The following may be used as further assistants or additives of this type:

a) Leveling agents, which are used for obtaining smooth, pit-free surfaces, b) Sensitizers, which improve the photosensitivity by extending the absorption range of the photoinitiator used, by effective transmission of radiation energy to the photoinitiator, e.g. anthraquinone, 2-methylanthraquinone, 2-ethylanthraquinone, benzoquinone, 1,2-naphthoquinone, 1,4-naphthoquinone, 1,2-benzanthraquinone, benzophenone, 4,4'-dimethylbenzophenone, Michler's ketone, 2-nitrofluorene, 5-nitroacetonaphthene, 4-nitro-1-naphthylamine, anthrone, 1,9-benzanthrone, dibenzalacetone,.4,4'-bis(diethylamino)benzophenone, acridine, cyanoacridine, nitropyrene, 1,8-dinitropyrene, pyrene-1,6-quinone, 2-bromobenzanthraquinone, 9-fluorenone, 2-chloro-1,8-phthaloylnaphthalene, etc., c) leuco dyes, e.g. leuco crystal violet, and d) adhesion promoters, e.g. 3-azidopropyltriethoxysilane.

The novel mixtures are used as photoresists for the production of relief structures which are stable at high temperatures, as used in the production of microelectronic components as insulation or passivation layers or as α-particle barriers.

The process for the production of photoresists and the production of relief structures which are stable at high temperatures from said photoresists can be carried out in a conventional manner.

The particular advantages of the novel mixtures and their further processing are their simple and readily reproducible production and the flexural strength and buckling resistance of relief structures produced therefrom.

In the Examples which follow, parts and percentages are by weight unless stated otherwise. Abbreviation

| PMDA | Pyromellitic dianhydride |
|---|---|
| BPDA | 3,3',4,4'-Benzophenonetetracarboxylic dianhydride |
| ODPA | 4,4'-Oxydiphthalic anhydride |
| BAPP | 2,2-Bis(4-(4-aminophenoxy)phenyl)propane |
| DADO | 4,4'-Diaminodiphenyl oxide |
| NMP | N-Methylpyrrolidone |
| DMAA | Dimethylacetamide |
| DMAP | 4-Dimethylaminopyridine |
| HEA | Hydroxymethyl acrylate |
| HEMA | Hydroxyethyl methacrylate |
| GDMA | Glyceryl dimethacrylate |
| TDG | Thiodiglycol |
| GMA | Glycidyl methacrylate |
| GA | Glycidyl acrylate |
| HQME | Hydroquinone monomethyl ether |
| LCV | Leuco crystal violet |
| MAZ | N-(4-Azidosulfonylphenyl)maleimide |
| A | Preparation of the precursors (I) |

(I)1:

In a dry apparatus, 54.5 g of PMDA were dissolved in 130.5 g of DMAA at 70° C. under very pure nitrogen, 0.4 g of DMAP was added and a solution of 102.6 g of BAPP in 185.0 g of NMP and 54.5 g of DMAA was introduced at 70° C. in the course of 2 hours. After the end of the addition, stirring was continued for a further 2 hours at 70° C. and the resulting viscous solution was cooled to room temperature.

Viscosity/solids content: 11,000 mPa.s/30%

Acid number: 53.3 (theory 53.5)

(I)2:

8.18 g of PMDA in 195.2 g of DMAA were initially taken in a dry apparatus at 30° C. under very pure nitrogen. 2.0 g of HEA were added and the mixture was stirred for 2 hours at 30° C., after which a solution of 153.9 g of BAPP and 0.6 g of DMAP in 277.2 g of NMP and 81.9 g of DMAA was added at 30° C. in the course of 2 hours and stirring was carried out for 1 hour at 30° C. A viscous solution was then heated at 70° C. for 2 hours.

Viscosity/solids content: 4,000 mPa.s/30%

Acid number: 53.4 (theory: 53.5)

(I)3:

The procedure was as in (I)2, except that 4.1 g of HEA were used.

Viscosity/solids content: 1,600 mPa.s/30%

Acid number: 53.5 (theory: 53.5)

(I)4:

The procedure was as in (I)3, except that 10.6 g of HEA were used.

Viscosity/solids content: 630 mPa.s/30%

Acid number: 53.6 (theory: 53.5)

(I)5:

The procedure was as in (I)1, except that 80.6 g of BPDA were used instead of PMDA.

Viscosity/solids content: 14,000 mPa.s/30%

Acid number: 45.6 (theory: 45.8)

(I)6:

The procedure was as in (I)1, except that 77.6 g of ODPA were used instead of PMDA.

Viscosity/solids content: 15,000 mPa.s/30%

Acid number: 46.3 (theory: 46.6)

B Preparation of the sulfonium salts (II)

(II)1:

279.4 g of TDG, 184.6 g of GMA, 0.18 g of HQME and 60 g of acetic acid were mixed at room temperature and then heated at 40° C. for 8 hours. The conversion relative to the acetic acid was then quantitative (potentiometric titration with tetrabutylammonium hydroxide). The yield of sulfonium acetate was 75% (potentiometric titration with perchloric acid).

(II)2 to (II)8:

As described in (II)1, the following sulfonium salts were prepared starting from various acids:

| Designation | Acid | Temperature/ Reaction time | Conversion of acid | Yield of sulfonium salt |
|---|---|---|---|---|
| (II)2 | Maleic acid | 40° C./5 h | 100% | 98% |
| (II)3 | Oxalic acid | 20° C./4 h | 96% | 95% |
| (II)4 | Propiolic acid | 20° C./6 h | 97% | 81% |
| (II)5 | Methanesulfonic acid | 20° C./1 h | 97% | not determined |
| (II)6 | Crotonic acid | 40° C./9 h | 97% | 71% |
| (II)7 | Cinnamic acid | 40° C./6 h | 90% | 67% |
| (II)8 | 4-(2-methacryloyloxyethyl) maleic acid | 40° C./7 h | 100% | 93% |

EXAMPLES 1 TO 16

Photoresist solutions were prepared from the polyheterocycle precursors prepared according to (I)1 to (II)6 by simple mixing of different amounts of the sulfonium compounds obtained according to (II)1 to (II)8 and by the addition of, in each case, 5% of MAZ (based on the total solids content of the photoresist) and 1% of LCV.

The photoresist solutions were applied to silicon wafers by spin coating in a layer thickness of 6 μm (dry), dried for 10 min at 80° C. on a hotplate and then exposed for 60 sec to a 360 W high pressure mercury lamp through a gray wedge mask with 15 steps (Multidensity Resolution Target from Optoline). The wafer was then developed with dimethylpropyleneurea in a spray developer for 60 seconds and then washed with isopropanol.

To test the mechanical properties, films of the photoresists were applied to sheet metal strips using a knife coater, dried at 90° C. for 30 minutes under $N_2$ and uniformly exposed. Thereafter, the films were heated to 400° C. at a heating rate of 3°/min in a plate drying oven under reduced pressure and were left at this temperature for 30 minutes. After slow cooling, the flexural strength and buckling resistance were tested.

Flexural strength:

For this purpose, the sheet metal strips were bent through 180° over an asymmetric mandrel (length 200 mm, diameter from 37 mm to 3 mm). Evaluation was based on the following scale:

1: The film does not tear at any point.
2: The film tears to not more than half the width of the mandrel.
3: The film tears to more than half the width of the mandrel.
4: The film tears over the entire mandrel width.

Buckling resistance:

This was tested using detached film strips and was evaluated according to the following scale:

1: The film does not break when flexed several times.
2: The film breaks only after being flexed several times.
3: The film breaks on flexing.
4: The film is brittle and breaks at the beginning of the flexing operation.

The test results are shown in the Table.

COMPARATIVE EXAMPLE 109.0 g of PMDA and 130.1 g of HEMA were stirred together with 400 g of γ-butyrolactone and 100 g of pyridine for 40 hours at room temperature. A solution of 100.1 g of DADO and 206 g of dicyclohexylcarbodiimide in 400 g of NMP was added dropwise to the resulting solution at 20° C. The reaction mixture was stirred overnight. The precipitated dicyclohexylurea was then filtered off. The solution obtained was precipitated in ethanol and the polyamic ester which had separated out was filtered off under suction and dried under reduced pressure. A 30% strength solution in NMP was prepared, and a resist was formulated therefrom by adding 5% of MAZ and 1% of LCV and was tested in the same manner as the novel resists described above.

TABLE

| Example No. | Precursor | Sulfonium salt/ Amount*) | Gray wedge step**) | Flexural strength | Buckling resistance |
| --- | --- | --- | --- | --- | --- |
| 1 | (I)1 | (II)2/100 | 18 | 2 | 3 |
| 2 | (I)1 | (II)3/100 | 14 | 2 | 2 |
| 3 | (I)1 | (II)3/75 | 12 | 1 | 1 |
| 4 | (I)1 | (II)3/65 | 14 | 1 | 1 |
| 5 | (I)1 | (II)3/50 | 24 | 1 | 1 |
| 6 | (I)1 | (II)4/70 | 22 | 2 | 2 |
| 7 | (I)1 | (II)5/70 | 16 | 1 | 1 |
| 8 | (I)1 | (II)6/75 | 25 | 1 | 2 |
| 9 | (I)1 | (II)7/70 | 22 | 1 | 1 |
| 10 | (I)1 | (II)8/75 | 25 | 1 | 2 |
| 11 | (I)1 | (II)2/70 | 20 | 2 | 2 |
| 12 | (I)2 | (II)3 9/70 | 18 | 1 | 1 |
| 13 | (I)3 | (II)3 9/70 | 22 | 1 | 1 |
| 14 | (I)4 | (II)3 9/70 | 25 | 1 | 2 |
| 15 | (I)5 | (II)3 9/70 | 14 | 1 | 1 |
| 16 | (I)6 | (II)3 9/70 | 14 | 1 | 1 |
| Comp. Example | — | — | 10 | 4 | 4 |

*) The amount in % by weight, based on the solids content of the precursor (I) used
**) The transmittance of the gray wedge step in % is stated, ie. the smaller the number, the higher the sensitivity.

We claim:

1. A radiation-crosslinkable mixture which consists essentially of the following components:

(I) at least one carboxyl-containing polymeric precursor of a heterocyclic polymer, which polymer is stable at high temperatures, and which precursor is soluble in polar organic solvent, (II) at least one copolymerizable ethylenically unsaturated ternary sulfonium salt, which salt is a reaction product of thiodiglycol with glycidyl(meth)acrylate and an organic mono-, di- or polycarboxylic acid, (III) at least one photoinitiator or photoinitiator system which is different form component (II), and (IV) at least one polar aprotic organic solvent.

2. A mixture as defined in claim 1, which contains, as component (I), a polyamic acid of the structure

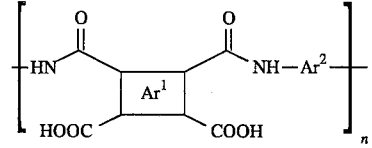

where the carboxyl groups are bonded to $Ar^1$ so that they are ortho or peri to the amido groups, $Ar^1$ is a tetravalent aromatic, araliphatic, alicyclic, aliphatic or heterocyclic radical and $Ar^2$ is a divalent aromatic, araliphatic, alicyclic, aliphatic or heterocyclic radical.

3. A mixture as defined in claim 2, wherein the polyamic acid is a random copolymer or block copolymer, at least two different groups $Ar^1$ or $Ar^2$ being present in the polyamic acid.

4. A mixture as defined in claim 2, where $Ar^1$ is selected from the tetravalent groups

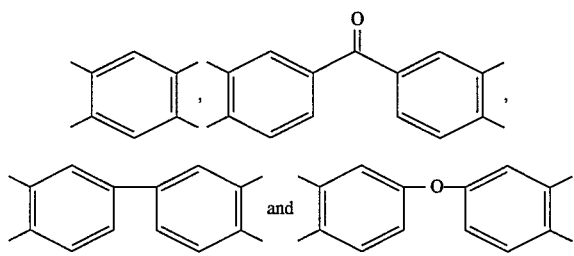
and Ar² is selected from the divalent groups
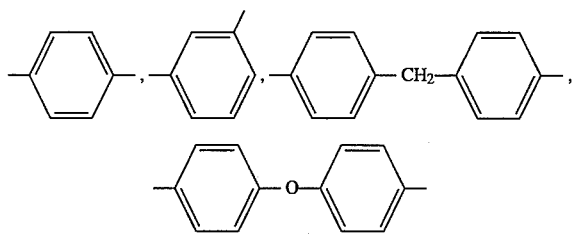
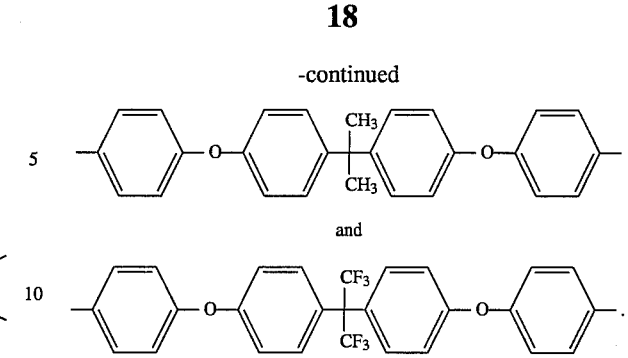
is used as component (I).
5. A mixture as defined in claim 1, wherein component (I) is a polyamic acid which carries ethylenically unsaturated terminal groups.
6. A mixture as defined in claim 1, wherein the ethylenically unsaturated groups present in component (II) are acrylate or methacrylate groups.
* * * * *